US012635378B2

(12) United States Patent
Qi

(10) Patent No.: US 12,635,378 B2
(45) Date of Patent: May 19, 2026

(54) DISPLAY SUBSTRATES AND DISPLAY APPARATUSES

(71) Applicants:Chengdu BOE Optoelectronics Technology Co., Ltd., Chengdu (CN); BOE Technology Group Co., Ltd., Beijing (CN)

(72) Inventor: Puyu Qi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 368 days.

(21) Appl. No.: 18/271,033

(22) PCT Filed: Apr. 20, 2022

(86) PCT No.: PCT/CN2022/087866
§ 371 (c)(1),
(2) Date: Jul. 5, 2023

(87) PCT Pub. No.: WO2023/201561
PCT Pub. Date: Oct. 26, 2023

(65) Prior Publication Data
US 2024/0389426 A1     Nov. 21, 2024

(51) Int. Cl.
*H10K 59/38* (2023.01)
*H10K 59/122* (2023.01)

(52) U.S. Cl.
CPC ........... *H10K 59/38* (2023.02); *H10K 59/122* (2023.02)

(58) Field of Classification Search
CPC ............................ H10K 59/38; H10K 59/122
(Continued)

(56) References Cited

U.S. PATENT DOCUMENTS

2015/0301408 A1    10/2015  Li
2018/0356574 A1    12/2018  Li et al.
(Continued)

FOREIGN PATENT DOCUMENTS

CN          103278876 A      9/2013
CN          107092048 A      8/2017
(Continued)

OTHER PUBLICATIONS

English translation of CN 110473900 A (Year: 2019).*
World Intellectual Property Organization (WIPO) Search of PCT (Year: 2023).*
PCT/CN2022/087866 international search report.
PCT/CN2022/087866 Written Opinion.

*Primary Examiner* — James R Greece
*Assistant Examiner* — Hana S Featherly
(74) *Attorney, Agent, or Firm* — IPro, PLLC

(57)          ABSTRACT
A display substrate and a display apparatus. The display substrate includes: a base substrate (10): a light-emitting device layer (20) on the base substrate (10); a filter layer (30) on a side of the light-emitting device layer (20) away from the base substrate (10); and an auxiliary layer (40) on a side of the filter layer (30) away from the base substrate (10). The light-emitting device layer (20) includes a plurality of sub-pixels (21), which include first sub-pixels (211) with a blue color and second sub-pixels (212) with a non-blue color. The filter layer (30) includes a shading portion (31) provided with a plurality of openings (301) and a plurality of filter portions (32) arranged at intervals, where the filter portions (32) are at least partially disposed in the openings (301), and an orthographic projection of each opening (301) onto the base substrate (10) covers an orthographic projection of one sub-pixel (21) onto the base substrate (10). The auxiliary layer (40) has a lower light transmittance to blue light than that to non-blue light, the auxiliary layer (40) is provided with a plurality of first hollowed-out portions (41), and an orthographic projection of the opening (301) corresponding
(Continued)

to each first sub-pixel (211) onto the base substrate (10) falls within an orthographic projection of one first hollowed-out portion (41) onto the base substrate (10). The phenomenon that a display area of the display substrate appears blue in a non-display state of the display substrate can be avoided. Meanwhile, the auxiliary layer has less influence on exit of light emitted from blue sub-pixels during display, thereby ensuring the normal display of the display substrate.

20 Claims, 3 Drawing Sheets

(58) Field of Classification Search
USPC .......................................................... 313/500
See application file for complete search history.

(56) References Cited

U.S. PATENT DOCUMENTS

| | | | |
|---|---|---|---|
| 2019/0245017 A1 | 8/2019 | Jeon et al. | |
| 2021/0233966 A1 | 7/2021 | Xu et al. | |

FOREIGN PATENT DOCUMENTS

| | | | |
|---|---|---|---|
| CN | 107316948 A | 11/2017 | |
| CN | 107565053 A | 1/2018 | |
| CN | 109659340 A | 4/2019 | |
| CN | 110335955 A | 10/2019 | |
| CN | 110473900 A | 11/2019 | |
| CN | 112106204 A | 12/2020 | |

* cited by examiner

DISPLAY SUBSTRATES AND DISPLAY APPARATUSES

CROSS-REFERENCE TO RELATED APPLICATIONS

This application is the U.S. national phase of PCT Application No. PCT/CN2022/087866 filed on Apr. 20, 2022, the disclosure of which is incorporated herein by reference in its entirety.

TECHNICAL FIELD

This application relates to the field of display technology, and in particular to a display substrate and a display apparatus.

BACKGROUND

OLEDs (Organic Light-Emitting Diodes) have been widely used in display devices due to wide viewing angle, fast response, and high contrast thereof.

A display area of the existing OLED display device appears blue in a non-display state, which affects the user experience.

SUMMARY

Embodiments of the present application provide a display substrate and a display apparatus.

According to a first aspect of embodiments of the present application, there is provided a display substrate, including:

a base substrate;

a light-emitting device layer on the base substrate, the light-emitting device layer including a plurality of sub-pixels, which include one or more first sub-pixels with a blue color and one or more second sub-pixels with a non-blue color;

a filter layer on a side of the light-emitting device layer away from the base substrate, the filter layer including a shading portion provided with a plurality of openings and a plurality of filter portions arranged at intervals, where the filter portions are at least partially disposed in the openings, and an orthographic projection of each of the openings onto the base substrate covers an orthographic projection of one of the sub-pixels onto the base substrate; and an auxiliary layer on a side of the filter layer away from the base substrate, the auxiliary layer having a lower light transmittance to blue light than that to non-blue light, where the auxiliary layer is provided with a plurality of first hollowed-out portions, and an orthographic projection of the opening corresponding to each of the first sub-pixels onto the base substrate falls within an orthographic projection of one of the first hollowed-out portions onto the base substrate.

In an embodiment, an orthographic projection of the auxiliary layer onto the base substrate covers orthographic projections of the openings corresponding to the second sub-pixels onto the base substrate.

In an embodiment, the auxiliary layer is provided with a plurality of second hollowed-out portions, and an orthographic projection of the opening corresponding to each of the second sub-pixels onto the base substrate falls within an orthographic projection of one of the second hollowed-out portions onto the base substrate.

In an embodiment, an edge of the orthographic projection of the first hollowed-out portion onto the base substrate is located outside an edge of an orthographic projection of a corresponding opening onto the base substrate.

In an embodiment, a distance between the edge of the orthographic projection of the first hollowed-out portion onto the base substrate and the edge of the orthographic projection of the corresponding opening onto the base substrate is a first distance, the first distance being in a range of $(0, 6 \mu m]$.

In an embodiment, an edge of the orthographic projection of the first hollowed-out portion onto the base substrate is located outside an edge of an orthographic projection of a corresponding opening onto the base substrate, and an edge of the orthographic projection of the second hollowed-out portion onto the base substrate is located outside an edge of an orthographic projection of a corresponding opening onto the base substrate.

In an embodiment, a distance between the edge of the orthographic projection of the first hollowed-out portion onto the base substrate and the edge of the orthographic projection of the corresponding opening onto the base substrate is a first distance, and a distance between the edge of the orthographic projection of the second hollowed-out portion onto the base substrate and the edge of the orthographic projection of the corresponding opening onto the base substrate is a second distance, where the first distance is greater than the second distance.

In an embodiment, the first distance is in a range of $(0, 6 \mu m]$, and the second distance is in a range of $(0, 3 \mu m]$.

In an embodiment, the auxiliary layer has a thickness in a range of $[1 \mu m, 3 \mu m]$.

In an embodiment, the display substrate further includes a cover plate on a side of the auxiliary layer away from the base substrate, the auxiliary layer being in direct contact with the cover plate.

In an embodiment, the display substrate further includes a first planarization layer filled in the first hollowed-out portions.

In an embodiment, the display substrate further includes a first planarization layer partially filled in the first hollowed-out portions and partially covering a surface of the auxiliary layer away from the base substrate; and a difference between a refractive index of the first planarization layer and a refractive index of the auxiliary layer is less than 0.1.

In an embodiment, the auxiliary layer is in direct contact with the filter layer.

In an embodiment, the display substrate further includes a second planarization layer between the filter layer and the auxiliary layer, and a difference between a refractive index of the second planarization layer and a refractive index of the auxiliary layer is less than 0.1.

In an embodiment, the display substrate further includes a pixel definition layer on the base substrate, the pixel definition layer being provided with a plurality of pixel openings, and the sub-pixels having at least part of film layers disposed within the pixel openings; and an orthographic projection of each of the pixel openings onto the base substrate falls within an orthographic projection of one of the openings onto the base substrate, and a distance between an edge of the orthographic projection of the pixel opening onto the base substrate and an edge of an orthographic projection of a corresponding opening onto the base substrate is in a range of $[0, 6 \mu m]$.

According to a second aspect of embodiments of the present application, there is provided a display apparatus including the display substrate as described above.

The embodiments of the present application mainly produce the following technical effects.

With the display substrate and the display apparatus according to the embodiments of the present application, an auxiliary layer is provided on a side of a filter layer away from a base substrate, and the auxiliary layer has a lower light transmittance to blue light than that to non-blue light, such that most of blue light reflected after external light is incident onto the display substrate is absorbed by the auxiliary layer, which can avoid the phenomenon that a display area of the display substrate appears blue in a non-display state, and improve the user experience. The auxiliary layer is provided with first hollowed-out portions, and an orthographic projection of an opening corresponding to each first sub-pixel onto the base substrate falls within an orthographic projection of one of the first hollowed-out portions onto the base substrate, such that the auxiliary layer has less influence on exit of light emitted from blue sub-pixels during display of the display substrate, which can ensure a normal display of the display substrate.

DETAILED DESCRIPTION

Figures 1, 2:
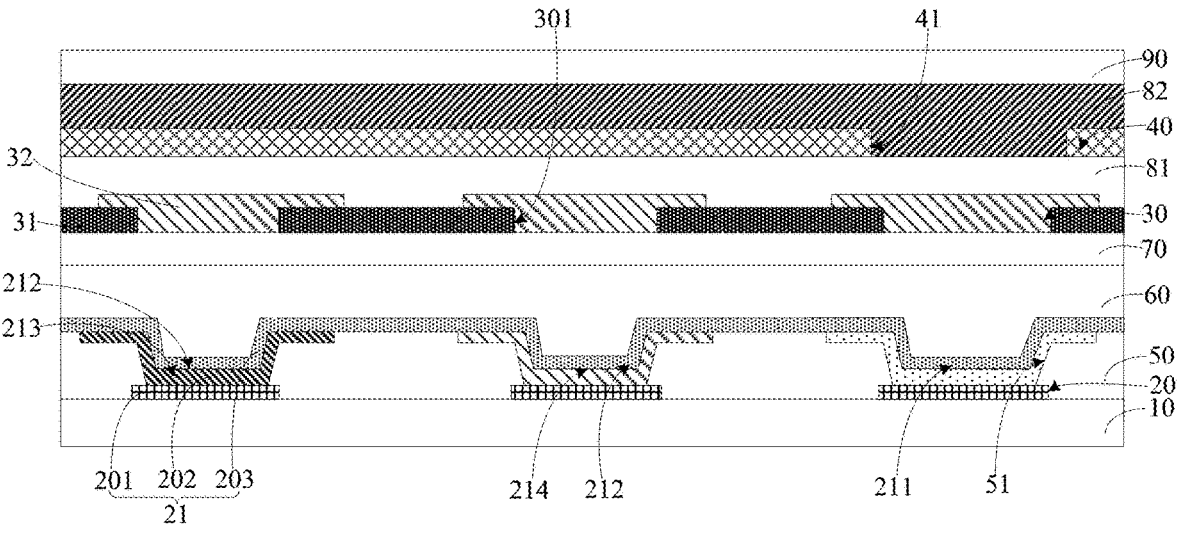
FIG. 1 is a partial cross-sectional view of a display substrate according to an exemplary embodiment of the present application.
FIG. 2 is a partial cross-sectional view of a display substrate according to another exemplary embodiment of the present application.

Reference will now be made in detail to exemplary embodiments, examples of which are illustrated in the accompanying drawings. When the following description refers to the drawings, the same numerals in different drawings indicate the same or similar elements, unless otherwise indicated. The embodiments described in the following exemplary embodiments are not intended to be representative of all embodiments consistent with the present application. Rather, they are merely examples of apparatuses and methods consistent with some aspects of the present application as detailed in the appended claims.

The terminology used in the present application is for the purpose of describing particular embodiments only, and is not intended to limit the present application. As used in the present application and the appended claims, singular forms of "a," "an," "said," and "the" are intended to include plural forms as well, unless the context clearly indicates otherwise. It should also be understood that the term "and/or" as used herein refers to and includes any or all possible combinations of one or more of the associated listed items.

It should be understood that, although the terms first, second, third, etc. may be used in the present application to describe various information, such information should not be limited by these terms. These terms are used only to distinguish the same type of information from one another. For example, the first information may also be referred to as the second information, and similarly, the second information may also be referred to as the first information, without departing from the scope of the present application. Depending on the context, the word "if" as used herein may be interpreted as "when." "upon" or "in response to determining".

As mentioned in the BACKGROUND, the display area of the existing OLED display device appears blue in the non-display state, which affects the user experience. The inventor found through research that, the reason for this problem is mainly that a blue sub-pixel in the OLED display device has a short lifespan, and in order to extend the lifespan of the blue sub-pixel, the blue sub-pixel is usually set to have a larger area than that of a red sub-pixel and that of a green sub-pixel in the OLED display device. Accordingly, in a filter layer of the OLED display device, a blue color resist has a larger area than that of a red color resist and that of a green color resist. In the non-display state of the OLED display device, external ambient light is incident onto an electrode of the sub-pixel through the filter layer and then is reflected, and when the reflected light passes through the color resist, most of light with a different color from the color resist is absorbed, and light with the same color as the color resist passes through the color resist and then exits. Due to the larger area of the blue color resist, the amount of blue light exiting from the OLED display device is larger than that of red light and that of green light, such that the display area of the OLED display device appears blue, while a frame area of the display substrate appears black in the non-display state, that is, the display area and the frame area of the display substrate appear different colors, which affects the user experience.

Embodiments of the present application provide a display substrate and a display apparatus, which can solve the above technical problems. The display substrate and the display apparatus in the embodiments of the present application will be described in detail below in conjunction with the accompanying drawings. Features in the embodiments described below may complement each other or be combined with each other without conflict.

An embodiment of the present application provides a display substrate. As shown in FIG. 1 to FIG. 6, the display substrate includes a base substrate 10, a light-emitting device layer 20, a filter layer 30, and an auxiliary layer 40.

The light-emitting device layer 20 is disposed on the base substrate 10. The light-emitting device layer 20 includes a plurality of sub-pixels 21, which include one or more first sub-pixels 211 with a blue color and one or more second sub-pixels 212 with a non-blue color.

The filter layer 30 is disposed on a side of the light-emitting device layer 20 away from the base substrate 10, and the filter layer 30 includes a shading portion 31 and a plurality of filter portions 32 arranged at intervals, where the shading portion 31 is provided with a plurality of openings 301 in which the filter portions 32 are at least partially disposed, and an orthographic projection of each of the openings 301 onto the base substrate 10 covers an orthographic projection of one of the sub-pixels 21 onto the base substrate 10. The openings 301 in the shading portion 31 may correspond to the sub-pixels 21 one by one, and the orthographic projection of each opening 301 onto the base substrate 10 covers the orthographic projection of the corresponding sub-pixel 21 onto the base substrate 10. The orthographic projection of the sub-pixel 21 onto the base substrate 10 refers to an orthographic projection of a light-emitting area of the sub-pixel 21 onto the base substrate 10.

The auxiliary layer 40 is disposed on a side of the filter layer 30 away from the base substrate 10, and the auxiliary layer 40 has a lower light transmittance to blue light than that to non-blue light. The auxiliary layer 40 is provided with a plurality of first hollowed-out portions 41, and an orthographic projection of the opening 301 corresponding to each of the first sub-pixels 211 onto the base substrate 10 falls within an orthographic projection of one of the first hollowed-out portions 41 onto the base substrate 10. The first sub-pixels 211 may correspond to the first hollowed-out portions 41 one by one, and the orthographic projection of the opening 301 corresponding to each of the first sub-pixels 211 onto the base substrate 10 falls within the orthographic projection of the first hollowed-out portion 41 corresponding to the first sub-pixel 211 onto the base substrate 10.

With the display substrate according to the embodiment of the present application, an auxiliary layer 40 is provided on a side of a filter layer 30 away from a base substrate 10, and the auxiliary layer 40 has a lower light transmittance to blue light than that to non-blue light, such that most of blue light reflected after external light is incident onto the display substrate is absorbed by the auxiliary layer 40, which can avoid the phenomenon that a display area of the display substrate appears blue in a non-display state, and improve the user experience. The auxiliary layer 40 is provided with first hollowed-out portions 41, and an orthographic projection of an opening 301 corresponding to each first sub-pixel 211 onto the base substrate 10 falls within an orthographic projection of one of the first hollowed-out portions 41 onto the base substrate 10, such that the auxiliary layer has less influence on exit of light emitted from blue sub-pixels during display of the display substrate, which can ensure a normal display of the display substrate.

In an embodiment, the display substrate includes a display area and a frame area at least on one side of the display area. The frame area may surround the display area. The frame area is black in both a display state and the non-display state of the display substrate. The sub-pixels 21 of the light-emitting device layer 20 are disposed in the display area. With the display substrate according to the embodiment of the present application, both the display area and the frame area of the display substrate are black in the non-display state of the display substrate, such that color difference between the display area and the frame area of the display substrate in the non-display state is reduced, and the user experience is improved.

In an embodiment, the base substrate 10 may be a flexible base substrate or a rigid base substrate. The flexible base substrate may be made of one or more of polyimide, polyethylene terephthalate, and polycarbonate. The rigid base substrate may be made of glass, silicon, etc.

In an embodiment, the display substrate further includes a pixel drive circuit layer between the base substrate 10 and the light-emitting device layer 20. The pixel drive circuit layer includes a plurality of pixel circuits corresponding to the sub-pixels one by one, and each pixel circuit is configured to drive a respective sub-pixel. The pixel circuit may include a thin-film transistor and a capacitor, for example, the pixel circuit may include seven thin-film transistors and one capacitor.

In an embodiment, as shown in FIG. 1 to FIG. 6, the light-emitting device layer 20 includes the sub-pixels 21 with at least three colors. That is, the second sub-pixels 212 include sub-pixels with at least two different colors, for example, the second sub-pixels 212 of the light-emitting device layer 20 include a red sub-pixel 213 and a green sub-pixel 214.

In an embodiment, the sub-pixel 21 includes a first electrode 201, a light-emitting material layer 202 on a side of the first electrode 201 away from the base substrate 10, and a second electrode 203 on a side of the light-emitting material layer 202 away from the base substrate 10. The first electrode 201 may be an anode, and the second electrode 203 may be a cathode. The first electrodes of the sub-pixels 21 are arranged at intervals, and the second electrodes 203 of the sub-pixels 21 may be a connected surface electrode. The light-emitting material layer may be an organic light-emitting material layer, that is, the display substrate is an OLED display substrate.

In an embodiment, as shown in FIG. 1 to FIG. 6, the display substrate further includes a pixel definition layer 50 on the base substrate 10, and the pixel definition layer 50 is partially disposed on a side of the first electrodes 201 away from the base substrate. The pixel definition layer 50 is provided with a plurality of pixel openings 51, and the sub-pixels 21 have at least part of film layers disposed within the pixel openings 51. The sub-pixels 21 may correspond to the pixel openings 51 one by one, and the pixel opening 51 defines the light-emitting area of the corresponding sub-pixel 21. The first electrode 201 of the sub-pixel 21 is on a side of the pixel definition layer 50 facing the base substrate 10, and the pixel opening 51 exposes a portion of the corresponding first electrode 201. The light-emitting material layer 202 of the sub-pixel 21 is at least partially within the corresponding pixel opening 51. The second electrode 203 of the sub-pixel is partially within the corresponding pixel opening 51 and partially on the pixel definition layer 50. An area defined by an end of the pixel opening 51 facing the base substrate 10 is the light-emitting area of the corresponding sub-pixel 21.

In an embodiment, as shown in FIGS. 1 to 6, the display substrate further includes an encapsulation layer 60 between the light-emitting device layer 20 and the filter layer 30. The encapsulation layer 60 may be a thin film encapsulation layer including organic layers and inorganic layers arranged alternately, and a film layer in the encapsulation layer 60 farthest from the base substrate 10 is the inorganic layer.

In an embodiment, as shown in FIG. 1 to FIG. 6, the display substrate further includes a touch layer 70 between the encapsulation layer 60 and the filter layer 30. The touch layer 70 includes a touch electrode.

In an embodiment, as shown in FIG. 1 to FIG. 6, the openings 301 in the shading portion 31 correspond to the sub-pixels 21 one by one, and an edge of an orthographic projection of each opening 301 onto the base substrate 10 is located outside an edge of an orthographic projection of the corresponding sub-pixel 21 onto the base substrate 10, that is, each opening 301 has an area larger than that of the light-emitting area of the corresponding sub-pixel 21. The filter portions 32 correspond to the sub-pixels 21 one by one, and each filter portion 32 has the same color as the emitting color of the corresponding sub-pixel 21. The filter portion 32 is partially in the corresponding opening 301 and partially covers the shading portion 31. Since the edge of the orthographic projection of the opening 301 onto the base substrate 10 is located outside the edge of the orthographic projection of the corresponding sub-pixel 21 onto the base substrate 10, almost all of the light emitted from the sub-pixel 21 can pass through the filter portion 32 in the corresponding opening

301. By providing the filter layer 30, the reflection of the external light incident onto the display substrate can be reduced, and the display effect of the display substrate can be improved. Since the filter layer 30 has a relatively small thickness, which is generally less than 5 μm, a thickness of the display substrate can be reduced compared with a scheme in which a polarizer is provided to reduce the reflection of the external ambient light incident onto the display substrate.

In an embodiment, as shown in FIG. 1 to FIG. 6, an orthographic projection of each pixel opening 51 onto the base substrate 10 falls within the orthographic projection of one of the openings 301 onto the base substrate 10. The pixel openings 51 may correspond to the openings 301 in the shading portion 31 one by one. An edge of the orthographic projection of the pixel opening 51 onto the base substrate 10 is located inside the edge of the orthographic projection of the corresponding opening 301 onto the base substrate 10. In this way, the shading portion 31 has less influence on exit of the light emitted from the sub-pixels 21, thereby ensuring the amount of light emitted from a side of the display substrate.

Further, a distance between the edge of the orthographic projection of the pixel opening 51 onto the base substrate 10 and the edge of the orthographic projection of the corresponding opening 301 onto the base substrate 10 is in a range of [0, 6 μm]. In this way, on the premise of ensuring the amount of light emitted from a side of the display substrate, cross-color caused by interference between light with different colors emitted from adjacent sub-pixels 21 can be avoided, and the display effect of the display substrate can be improved. In some embodiments, the distance between the edge of the orthographic projection of the pixel opening 51 onto the base substrate 10 and the edge of the orthographic projection of the corresponding opening 301 onto the base substrate 10 is, for example, 0 μm, 1 μm, 2 μm, 3 μm, 4 μm, 5 μm, 6 μm, etc.

In an embodiment, the shading portion 31 has a thickness ranging from 1 μm to 3 μm. In this way, it is possible to avoid the shading portion 31 being too thin, resulting in light crosstalk between adjacent sub-pixels 21, and to avoid the shading portion 31 being too thick, resulting in an increase in the thickness of the display substrate. In some embodiments, the thickness of the shading portion 31 is, for example, 1 μm, 1.5 μm, 2.0 μm, 2.5 μm, 3 μm, etc.

In an embodiment, the filter portion 32 has a thickness ranging from 2 μm to 4 μm. In this way, it is possible to avoid the filter portion 32 being too thin, resulting in a poor filter effect of light by the filter portion 32, and to avoid the filter portion 32 being too thick, resulting in an increase in the thickness of the display substrate. In some embodiments, the thickness of the filter portion 32 is, for example, 2 μm, 2.5 μm, 3.0 μm, 3.5 μm, 4 μm, etc.

In an embodiment, the auxiliary layer 40 has a much lower light transmittance to blue light than that to red or green light. For example, the light transmittance of the auxiliary layer 40 to light in a wavelength band of 505 nm to 780 nm is not less than 95%, and the light transmittance of the auxiliary layer 40 to light in a wavelength band of 380 nm to 480 nm is no more than 3%. The material of the auxiliary layer 40 may include a resin material and a doping material doped in the resin material, and the light transmittance of the doping material to the blue light is lower than that to the red or green light.

In an embodiment, as shown in FIGS. 1 to 6, an edge of the orthographic projection of the first hollowed-out portion 41 onto the base substrate 10 is located outside the edge of the orthographic projection of the corresponding opening 301 onto the base substrate 10. In this way, almost all of the light emitted from the first sub-pixel 211 can exit through the first hollowed-out portion 41 after passing through the corresponding opening 301, which can reduce the amount of the light emitted from the first sub-pixel 211 that is absorbed by the auxiliary layer 40, thereby improving the brightness of the display substrate and ensuring the amount of light emitted from a side of the display substrate.

Further, a distance between the edge of the orthographic projection of the first hollowed-out portion 41 onto the base substrate 10 and the edge of the orthographic projection of the corresponding opening 301 onto the base substrate 10 is a first distance, where the first distance is in a range of (0), 6 μm]. In this way, on the premise of ensuring a small amount of the light emitted from the first sub-pixel 211 that is absorbed by the auxiliary layer 40, it is possible to avoid the first distance between the edge of the orthographic projection of the first hollowed-out portion 41 onto the base substrate 10 and the edge of the orthographic projection of the corresponding opening 301 onto the base substrate 10 being too large, and thus an area of the shading portion 31 exposed by the first hollowed-out portion 41 being too large, causing more of the light reflected after the external ambient light is incident onto the shading portion 31 cannot pass through the auxiliary layer 40 and exits directly, of which more blue light exits, such that the phenomenon that the display area of the display substrate appears blue in the non-display state of the display substrate cannot be effectively avoided. In some embodiments, the first distance is, for example, 0.5 μm, 1 μm, 2 μm, 3 μm, 4 μm, 5 μm, 6 μm, etc.

Figure 3:
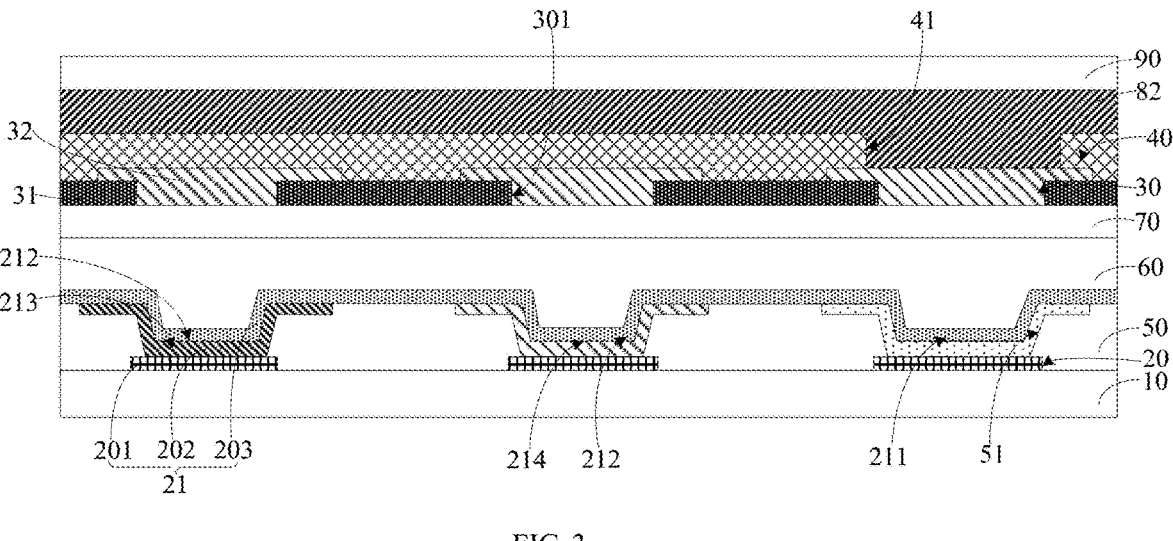
FIG. 3 is a partial cross-sectional view of a display substrate according to still another exemplary embodiment of the present application.
Figures 5, 6:
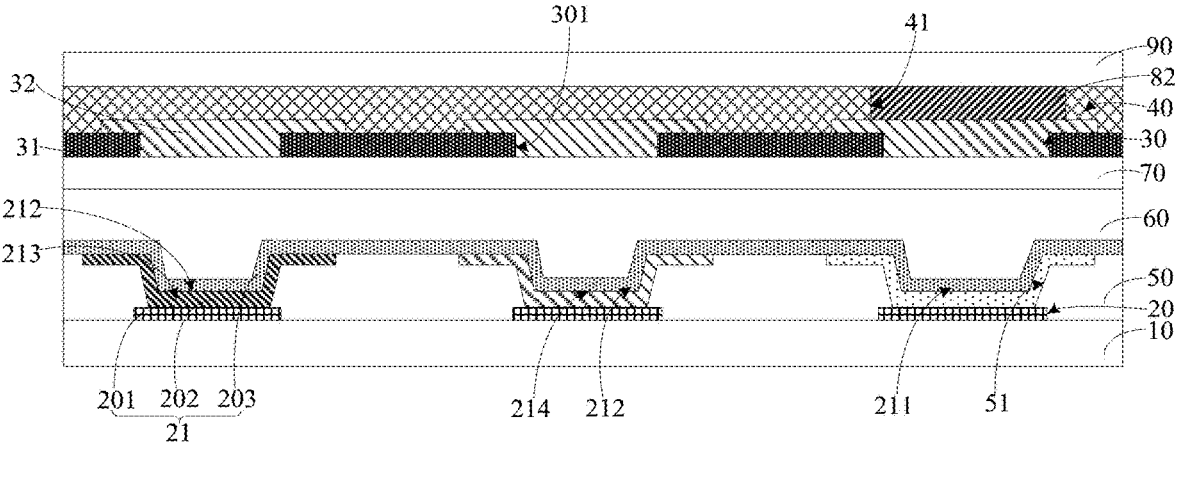
FIG. 5 is a partial cross-sectional view of a display substrate according to yet another exemplary embodiment of the present application.
FIG. 6 is a partial cross-sectional view of a display substrate according to yet another exemplary embodiment of the present application.

In an embodiment, as shown in FIGS. 1, 3 and 5, an orthographic projection of the auxiliary layer 40 onto the base substrate 10 covers orthographic projections of the openings 301 corresponding to the second sub-pixels 212 onto the base substrate 10. In this way, the external ambient light incident onto the display substrate is reflected by the electrodes of the second sub-pixels 212, and then sequentially passes through the filter layer 30 and the auxiliary layer 40. When the light passes through the auxiliary layer 40, the blue light is absorbed by the auxiliary layer 40, which is more helpful to avoid the phenomenon that the display area of the display substrate appears blue in the non-display state of the display substrate. Moreover, when the light emitted from the second sub-pixels 212 passes through the auxiliary layer 40 in the display state of the display substrate, most of the light exits through the auxiliary layer 40 because of a high light transmittance of the auxiliary layer 40 to the red light and the green light, and the auxiliary layer 40 does not affect the normal display of the display substrate.

In this embodiment, the auxiliary layer 40 may be provided with the first hollowed-out portions 41 only in a region opposite to the first sub-pixels 211, and is not hollowed out in other regions, that is, the auxiliary layer 40 covers most of the shading portion 31. After the external ambient light is incident onto the shading portion 31 and is reflected at the shading portion 31, and after the external ambient light is incident onto the electrodes of the first sub-pixels 211 and is reflected at the electrodes, the blue light in the reflected light is absorbed by the auxiliary layer 40 when the reflected light passes through the auxiliary layer 40, which is more helpful to avoid the phenomenon that the display area of the display substrate appears blue in the non-display state of the display substrate.

Figure 4:
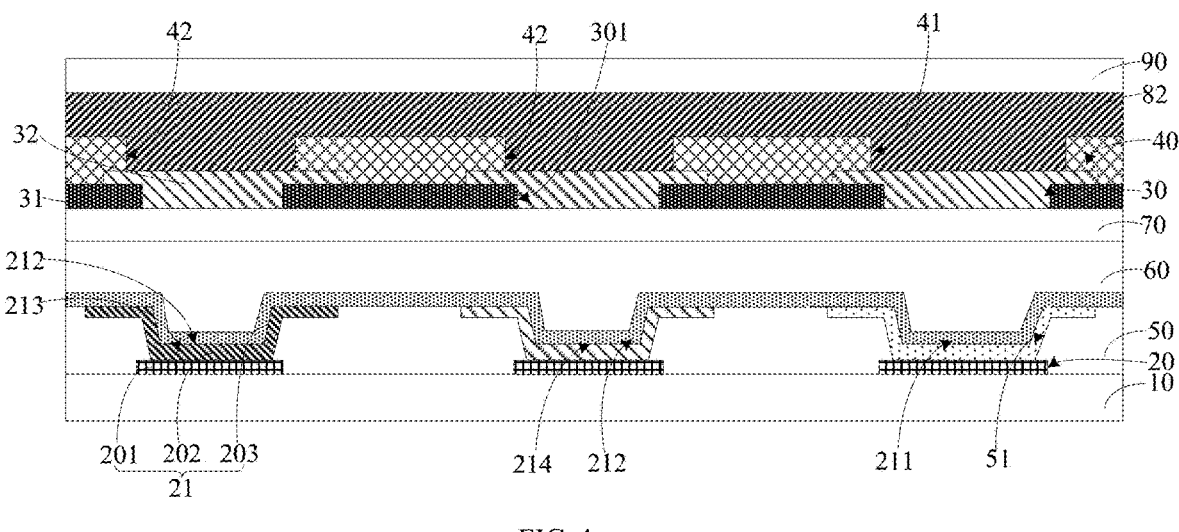
FIG. 4 is a partial cross-sectional view of a display substrate according to yet another exemplary embodiment of the present application.

In another embodiment, as shown in FIG. 2, FIG. 4 and FIG. 6, the auxiliary layer 40 is provided with a plurality of second hollowed-out portions 42, and an orthographic projection of the opening 301 corresponding to each of the second sub-pixels 212 onto the base substrate 10 falls within an orthographic projection of one of the second hollowed-out portions 42 onto the base substrate 10. The second sub-pixels 212 may correspond to the second hollowed-out portions 42 one by one, and the orthographic projection of the opening 301 corresponding to each second sub-pixel 212 onto the base substrate 10 falls within the orthographic projection of the second hollowed-out portion 42 corresponding to the second sub-pixel 212 onto the base substrate 10. In this way, the auxiliary layer 40 covers only part of the shading portion 31, and none of the openings 301 is covered by the auxiliary layer 40. In the display state of the display substrate, most of the light emitted from the second sub-pixels 212 may exit through the second hollowed-out portions 42 without being absorbed by the auxiliary layer 40, resulting in less loss of the light emitted from the second sub-pixels 212.

In an embodiment, as shown in FIG. 2, FIG. 4 and FIG. 6, the edge of the orthographic projection of the first hollowed-out portion 41 onto the base substrate 10 is located outside the edge of the orthographic projection of the corresponding opening 301 onto the base substrate 10. An edge of the orthographic projection of the second hollowed-out portion 42 onto the base substrate 10 is located outside the edge of the orthographic projection of the corresponding opening 301 onto the base substrate 10. In this way, after the light emitted from the first sub-pixel 211 passes through the corresponding opening 301, almost all of the light may exit through the first hollowed-out portion 41, which can reduce the amount of the light emitted from the first sub-pixel 211 that is absorbed by the auxiliary layer 40, thereby improving the brightness of the display substrate and ensuring the amount of light emitted from a side of the display substrate. After the light emitted from the second sub-pixel 212 passes through the corresponding opening 301, almost all of the light may exit through the second hollowed-out portion 42, which can reduce the amount of the light emitted from the second sub-pixel 212 that is absorbed by the auxiliary layer 40, thereby improving the brightness of the display substrate and ensuring the amount of light emitted from a side of the display substrate.

Further, the distance between the edge of the orthographic projection of the first hollowed-out portion 41 onto the base substrate 10 and the edge of the orthographic projection of the corresponding opening 301 onto the base substrate 10 is the first distance. A distance between the edge of the orthographic projection of the second hollowed-out portion 42 onto the base substrate 10 and the edge of the orthographic projection of the corresponding opening 301 onto the base substrate 10 is a second distance. The first distance is greater than the second distance. The auxiliary layer 40 has a low light transmittance to the light emitted from the first sub-pixels 211. By setting the first distance to be greater than the second distance, it is possible to avoid the light emitted from the first sub-pixels 211 being absorbed by the auxiliary layer 40 in the display state of the display substrate, resulting in a small amount of light emitted from a side of the display substrate. The auxiliary layer 40 has a high light transmittance to the light emitted from the second sub-pixels 212. Even if the second distance is less than the first distance, a small amount of the light emitted from the second sub-pixel 212 is absorbed by the auxiliary layer 40 in the display state of the display substrate, which can ensure the amount of light emitted from a side of the display substrate and enable the auxiliary layer 40 to cover a larger area of the shading portion, thereby avoiding the phenomenon that the display area of the display substrate appears blue in the non-display state of the display substrate.

Further, the first distance is in a range of (0, 6 μm], and the second distance is in a range of (0), 3 μm]. By setting the first distance to be in the range of (0, 6 μm], on the premise of ensuring a small amount of light emitted from the first sub-pixel 211 that is absorbed by the auxiliary layer 40 in the display state of the display substrate, it is possible to avoid the first distance between the edge of the orthographic projection of the first hollowed-out portion 41 onto the base substrate 10 and the edge of the orthographic projection of the corresponding opening 301 onto the base substrate 10 being too large, and thus an area of the shading portion 31 exposed by the first hollowed-out portion 41 being too large, causing more of the light reflected after the external ambient light is incident onto the shading portion 31 cannot pass through the auxiliary layer 40 and exits directly, of which more blue light exits, such that the phenomenon that the display area of the display substrate appears blue in the non-display state of the display substrate cannot be effectively avoided. By setting the second distance to be in the range of (0, 3 μm], it can be ensured that a small amount of light emitted from the second sub-pixel 212 is absorbed by the auxiliary layer 40 in the display state of the display substrate to ensure the amount of light emitted from a side of the display substrate, and it can also be ensured that in the non-display state of the display substrate, most of the light reflected after the external ambient light is incident onto the shading portion 31 has to exit through the auxiliary layer 40, of which less blue light exits, thereby effectively avoiding the phenomenon that the display area of the display substrate appears blue in the non-display state of the display substrate. In some embodiments, the first distance is, for example, 0.5 μm, 1 μm, 2 μm, 3 μm, 4 μm, 5 μm, 6 μm, etc., and the second distance is, for example, 0.5 μm, 1 μm, 2 μm, 3 μm, etc.

In an embodiment, the auxiliary layer 40 has a thickness in a range of [1 μm, 3 μm]. In this way, it is possible to avoid the auxiliary layer 40 being too thin, resulting in a poor absorption effect of the auxiliary layer 40 in absorbing the blue light, such that the phenomenon that the display area of the display substrate appears blue in the non-display state cannot be effectively avoided. It is also possible to avoid the auxiliary layer 40 being too thick, resulting in a large increase in the thickness of the display substrate. In some embodiments, the thickness of the auxiliary layer 40 is, for example, 1 μm, 1.5 μm, 2.0 μm, 2.5 μm, 3 μm, etc.

In an embodiment, as shown in FIGS. 3 to 6, the auxiliary layer 40 is in direct contact with the filter layer 30. In the case that a planarization layer is disposed between the auxiliary layer 40 and the filter layer 30, if the refractive index of the auxiliary layer 40 differs significantly from that of the planarization layer, the light emitted from the sub-pixel 21 may be reflected when it is incident at an interface between the auxiliary layer 40 and the planarization layer, the reflected light is incident again onto the electrode of the sub-pixel or a conductive structure of the pixel drive circuit layer, and finally exits through the first hollowed-out portion 41 or the second hollowed-out portion 42 in the auxiliary layer 40. This may lead to light crosstalk between adjacent sub-pixels, and much loss of the light emitted from the sub-pixel 21 before it exits. Moreover, when the incident light of the external ambient light is reflected by the electrode of the sub-pixel and then incident at the interface between the planarization layer and the auxiliary layer 40, the light is totally reflected again, and finally exits through the first hollowed-out portion 41 or the second hollowed-out portion 42 in the auxiliary layer 40, which cannot effectively avoid the phenomenon that the display area of the display substrate appears blue in the non-display state of the display substrate. With the embodiment of the present application, the above phenomenon can be avoided or mitigated, the thickness of the display substrate can be reduced, and the display substrate can be lightened and thinned.

In this embodiment, the auxiliary layer 40 is partially filled in gaps between adjacent filter portions 32.

In an embodiment, as shown in FIG. 5 and FIG. 6, the display substrate further includes a cover plate 90 on a side of the auxiliary layer 40 away from the base substrate, and the auxiliary layer 40 is in direct contact with the cover plate 90. In the case that a planarization layer is disposed between the auxiliary layer 40 and the cover plate 90, when the external ambient light passes through the cover plate 90 and the planarization layer, if the refractive index of the planarization layer differs significantly from that of the auxiliary layer 40, the external ambient light may be totally reflected at an interface between the planarization layer and the auxiliary layer 40, that is, the incident external ambient light may not pass through the auxiliary layer 40. In this case, the blue light in the external ambient light cannot be effectively absorbed, which is not conducive to avoiding the phenomenon that the display area of the display substrate appears blue in the non-display state. With the embodiment of the present application, the auxiliary layer 40 is disposed in direct contact with the cover plate 90, such that the above problem can be avoided, and the thickness of the display substrate can be reduced.

In an embodiment, as shown in FIG. 5 and FIG. 6, the display substrate further includes a first planarization layer 82, which is filled within the first hollowed-out portion 41. When the auxiliary layer 40 is provided with the second hollowed-out portion 42, the first planarization layer 82 is partially filled within the second hollowed-out portion 42. In this way, a surface of the first planarization layer 82 away from the base substrate 10 may be flush with a surface of the auxiliary layer 40 away from the base substrate 10, which is convenient to subsequently provide the cover plate 90 on the side of the auxiliary layer 40 away from the base substrate 10.

In another embodiment, as shown in FIG. 1 to FIG. 4, the display substrate further includes a first planarization layer 82. The first planarization layer 82 is partially filled in the first hollowed-out portion 41 and partially covers a surface of the auxiliary layer 40 away from the base substrate 10. A difference between a refractive index of the first planarization layer 82 and a refractive index of the auxiliary layer 40 is less than 0.1. When the auxiliary layer 40 is provided with the second hollowed-out portion 42, the first planarization layer 82 is partially filled in the second hollowed-out portion 42. In this way, a surface of the first planarization layer 82 away from the base substrate 10 has good flatness, which facilitates the arrangement of the cover plate 90. Moreover, the difference between the refractive index of the first planarization layer 82 and the refractive index of the auxiliary layer 40 is less than 0.1, and the external ambient light incident onto the first planarization layer 82 can pass through the auxiliary layer 40 to be incident at an interface between the auxiliary layer 40 and the shading portion 31. It can be ensured that the light reflected at the interface between the auxiliary layer 40 and the shading portion 31 exits through the auxiliary layer 40 and the first planarization layer 82 again, thereby effectively avoiding the phenomenon that the display area of the display substrate appears blue in the non-display state.

In this embodiment, the smaller the difference between the refractive index of the first planarization layer 82 and the refractive index of the auxiliary layer 40 is, the more advantageous it is to prevent the external incident light from being reflected at an interface between the first planarization layer 82 and the auxiliary layer 40. The refractive index of the first planarization layer 82 is as close as possible to the refractive index of the auxiliary layer 40 as the available process allows.

Further, the first planarization layer 82 has a thickness in a range of [1 μm, 3 μm]. In this way, it can be avoided that the first planarization layer 82 is too thin, resulting in poor flatness of the surface of the first planarization layer 82 away from the base substrate 10. It can also be avoided that the first planarization layer 82 is too thick, resulting in an increase in the thickness of the display substrate, which is not conducive to realizing a light and thin display substrate. In some embodiments, the thickness of the first planarization layer 82 is, for example, 1 μm, 1.5 μm, 2.0 μm, 2.5 μm, 3 μm, etc. The first planarization layer 82 may be made of resin.

In an embodiment, as shown in FIG. 1 and FIG. 2, the display substrate further includes a second planarization layer 81 between the filter layer 30 and the auxiliary layer 40, and a difference between a refractive index of the second planarization layer 81 and the refractive index of the auxiliary layer 40 is less than 0.1. In this way, a surface of the second planarization layer 81 away from the base substrate 10 has good flatness, which facilitates the formation of the auxiliary layer 40 on the surface of the second planarization layer 81 away from the base substrate 10. Moreover, the difference between the refractive index of the second planarization layer 81 and the refractive index of the auxiliary layer 40 is less than 0.1, which can avoid light crosstalk between adjacent pixels and help to avoid the phenomenon that the display area of the display substrate appears blue in the non-display state.

In this embodiment, the second planarization layer 81 is partially filled in the gaps between adjacent filter portions 32.

In this embodiment, the second planarization layer 81 has a thickness in a range of [1 μm, 3 μm]. In this way, it can be avoided that the second planarization layer 81 is too thin, resulting in poor flatness of the surface of the second planarization layer 81 away from the base substrate 10. It can also be avoided that the second planarization layer 81 is too thick, resulting in an increase in the thickness of the display substrate, which is not conducive to realizing a light and thin display substrate. In some embodiments, the thickness of the second planarization layer 81 is, for example, 1 μm, 1.5 μm, 2.0 μm, 2.5 μm, 3 μm, etc. The second planarization layer 81 may be made of resin.

An embodiment of the present application further provides a method of preparing the display substrate. A process of preparing the display substrate will be described below by taking the embodiment shown in FIG. 6 as an example. In particular, "patterning process" in the embodiment of the present application includes deposition of a film layer, coating of a photoresist, mask exposure, development, etching, and peeling-off of the photoresist. The deposition may be done by any one or more of sputtering, evaporation, and chemical vapor deposition, and the etching may be done by any one or more of dry etching and wet etching. A "film" refers to a layer of film produced by depositing or coating a material on a substrate. The "film" may also be referred to as a "layer" if it does not require a patterning process throughout the production process. If the "film" requires a patterning process throughout the production process, it is referred to as a "film" before the patterning process and as a "layer" after the patterning process. The "layer" after the patterning process contains at least one "pattern".

The method of preparing the display substrate includes the following steps.

Firstly, a base substrate 10 is provided.

Subsequently, a pixel drive circuit layer is formed on the base substrate.

Subsequently, a first electrode film is deposited on the pixel drive circuit layer, and the first electrode film is patterned by a patterning process to obtain a plurality of first electrodes 201.

Subsequently, a pixel definition film is deposited on the first electrodes, and the pixel definition film is patterned by a patterning process to form a pixel definition layer 50 provided with a plurality of pixel openings 51.

Subsequently, a light-emitting material layer 202 is deposited.

Subsequently, a second electrode film is deposited on the light-emitting material layer 202 to obtain a second electrode 203.

Subsequently, an encapsulation layer 60 is formed on the second electrode 203.

Then, a touch layer 70 is formed on the encapsulation layer 60.

Then, a shading film is deposited on the touch layer 70, and the shading film is patterned by a patterning process to form openings 301, thereby obtaining a shading portion 31.

Then, a filter film is deposited, and the filter film is patterned by a patterning process to form filter portions 32, where the filter portions 32 are at least partially in the openings 301. The filter portions 32 with different colors are not formed at the same time.

Then, an auxiliary film is deposited, and the auxiliary film is patterned by a patterning process to form first hollowed-out portions 41 and second hollowed-out portions 42, thereby obtaining an auxiliary layer 40.

Subsequently, a planarization film is deposited, and the planarization film is patterned by a patterning process to form a first planarization layer 82 filled in the first hollowed-out portions 41 and the second hollowed-out portions 42.

Then, a cover plate 90 is attached on the auxiliary layer 40 and the first planarization layer 82.

The method of preparing the display substrate according to the embodiment of the present application and the display substrate belong to the same inventive concept, and the description of relevant details and beneficial effects can be cross-referenced and will not be repeated.

An embodiment of the present application further provides a display apparatus, including the display substrate according to any one of the above embodiments.

In an embodiment, the display apparatus further includes a housing, in which the display substrate is disposed.

The display apparatus according to the embodiment of the present application may be any device with a display function, such as a mobile phone, a tablet computer, a television, a notebook computer, and a vehicle-mounted device.

It should be noted that in the accompanying drawings, sizes of layers and regions may be exaggerated for clarity of illustration. Also, it can be understood that when an element or layer is referred to as being "on" another element or layer, it may be directly on the other element, or there may be an intervening layer. In addition, it can be understood that when an element or layer is referred to as being "under" another element or layer, it may be directly under the other element, or there may be more than one intervening layer or element. Additionally, it can be understood that when a layer or element is referred to as being "between" two layers or elements, it may be the only layer between the two layers or elements, or there may be more than one intervening layer or element. Like reference numerals refer to like elements throughout.

Other embodiments of the present application will readily occur to those skilled in the art upon consideration of the specification and practice of the disclosure disclosed herein. The present application is intended to cover any variations, uses, or adaptations of the present application that follow the general principles of the present application and include common general knowledge or conventional technical means in the art not disclosed herein. The specification and embodiments are to be considered exemplary only, with a true scope and spirit of the present application being indicated by the following claims.

It should be understood that the present application is not limited to the precise structures which have been described above and illustrated in the accompanying drawings, and that various modifications and changes may be made without departing from the scope thereof. The scope of the present application is limited only by the appended claims.

The invention claimed is:

1. A display substrate, comprising:
a base substrate;
a light-emitting device layer on the base substrate, the light-emitting device layer comprising a plurality of sub-pixels, which comprise one or more first sub-pixels with a blue color and one or more second sub-pixels with a non-blue color;
a filter layer on a side of the light-emitting device layer away from the base substrate, the filter layer comprising a shading portion provided with a plurality of openings and a plurality of filter portions arranged at intervals, wherein the filter portions are at least partially disposed in the openings, and an orthographic projection of each of the openings onto the base substrate covers an orthographic projection of one of the sub-pixels onto the base substrate; and
an auxiliary layer on a side of the filter layer away from the base substrate, the auxiliary layer having a lower light transmittance to blue light than that to non-blue light, wherein the auxiliary layer is provided with a plurality of first hollowed-out portions, and an orthographic projection of the opening corresponding to each of the first sub-pixels onto the base substrate falls within an orthographic projection of one of the first hollowed-out portions onto the base substrate,
wherein an orthographic projection of the auxiliary layer onto the base substrate covers orthographic projections of the openings corresponding to the second sub-pixels onto the base substrate.

2. The display substrate according to claim 1, wherein an edge of the orthographic projection of the first hollowed-out portion onto the base substrate is located outside an edge of an orthographic projection of a corresponding opening onto the base substrate.

3. The display substrate according to claim 2, wherein a distance between the edge of the orthographic projection of the first hollowed-out portion onto the base substrate and the edge of the orthographic projection of the corresponding opening onto the base substrate is a first distance, the first distance being greater than 0 µm and less than or equal to, 6 µm.

4. The display substrate according to claim 1, wherein the auxiliary layer has a thickness greater than or equal to 1 μm, and less than or equal to 3 μm.

5. The display substrate according to claim 1, further comprising a cover plate on a side of the auxiliary layer away from the base substrate, the auxiliary layer being in direct contact with the cover plate.

6. The display substrate according to claim 5, further comprising a first planarization layer filled in the first hollowed-out portions.

7. The display substrate according to claim 1, further comprising a first planarization layer partially filled in the first hollowed-out portions and partially covering a surface of the auxiliary layer away from the base substrate, wherein a difference between a refractive index of the first planarization layer and a refractive index of the auxiliary layer is less than 0.1.

8. The display substrate according to claim 1, wherein the auxiliary layer is in direct contact with the filter layer.

9. The display substrate according to claim 1, further comprising a second planarization layer between the filter layer and the auxiliary layer, wherein a difference between a refractive index of the second planarization layer and a refractive index of the auxiliary layer is less than 0.1.

10. The display substrate according to claim 1, further comprising a pixel definition layer on the base substrate, the pixel definition layer being provided with a plurality of pixel openings, and the sub-pixels having at least part of film layers disposed within the pixel openings, wherein an orthographic projection of each of the pixel openings onto the base substrate falls within an orthographic projection of one of the openings onto the base substrate, and a distance between an edge of the orthographic projection of the pixel opening onto the base substrate and an edge of an orthographic projection of a corresponding opening onto the base substrate is greater than or equal to 0 μm, and less than or equal to 6 μm.

11. A display apparatus, comprising the display substrate according to claim 1.

12. A display substrate, comprising:

a base substrate;

a light-emitting device layer on the base substrate, the light-emitting device layer comprising a plurality of sub-pixels, which comprise one or more first sub-pixels with a blue color and one or more second sub-pixels with a non-blue color;

a filter layer on a side of the light-emitting device layer away from the base substrate, the filter layer comprising a shading portion provided with a plurality of openings and a plurality of filter portions arranged at intervals, wherein the filter portions are at least partially disposed in the openings, and an orthographic projection of each of the openings onto the base substrate covers an orthographic projection of one of the sub-pixels onto the base substrate; and an auxiliary layer on a side of the filter layer away from the base substrate, the auxiliary layer having a lower light transmittance to blue light than that to non-blue light, wherein the auxiliary layer is provided with a plurality of first hollowed-out portions, and an orthographic projection of the opening corresponding to each of the first sub-pixels onto the base substrate falls within an orthographic projection of one of the first hollowed-out portions onto the base substrate, wherein the auxiliary layer is provided with a plurality of second hollowed-out portions, and an orthographic projection of the opening corresponding to each of the second sub-pixels onto the base substrate falls within an orthographic projection of one of the second hollowed-out portions onto the base substrate.

13. The display substrate according to claim 12, wherein an edge of the orthographic projection of the first hollowed-out portion onto the base substrate is located outside an edge of an orthographic projection of a corresponding opening onto the base substrate, and an edge of the orthographic projection of the second hollowed-out portion onto the base substrate is located outside an edge of an orthographic projection of a corresponding opening onto the base substrate.

14. The display substrate according to claim 13, wherein a distance between the edge of the orthographic projection of the first hollowed-out portion onto the base substrate and the edge of the orthographic projection of the corresponding opening onto the base substrate is a first distance, and a distance between the edge of the orthographic projection of the second hollowed-out portion onto the base substrate and the edge of the orthographic projection of the corresponding opening onto the base substrate is a second distance, wherein the first distance is greater than the second distance.

15. The display substrate according to claim 14, wherein the first distance is greater than 0 μm, and less than or equal to 6 μm, and the second distance is greater than 0 μm and less than or equal to 3 μm.

16. The display substrate according to claim 12, wherein the auxiliary layer has a thickness greater than or equal to 1 μm and less than or equal to 3 μm.

17. The display substrate according to claim 12, further comprising a first planarization layer partially filled in the first hollowed-out portions and partially covering a surface of the auxiliary layer away from the base substrate, wherein a difference between a refractive index of the first planarization layer and a refractive index of the auxiliary layer is less than 0.1.

18. The display substrate according to claim 12, wherein the auxiliary layer is in direct contact with the filter layer.

19. The display substrate according to claim 12, further comprising a second planarization layer between the filter layer and the auxiliary layer, wherein a difference between a refractive index of the second planarization layer and a refractive index of the auxiliary layer is less than 0.1.

20. A display apparatus, comprising the display substrate according to claim 12.

* * * * *